United States Patent
Fischer et al.

(10) Patent No.: US 7,561,175 B2
(45) Date of Patent: Jul. 14, 2009

(54) METHOD AND DEVICE FOR COMPENSATING FOR A TEMPERATURE-DEPENDENT LENGTH CHANGE OF THE FEED SPINDLE OF A PRINTING PLATE EXPOSER

(75) Inventors: Jörg-Achim Fischer, Laboe (DE); Bernd Lassen, Mönkeberg (DE)

(73) Assignee: Heidelberger Druckmaschinen AG, Heidelberg (DE)

( * ) Notice: Subject to any disclaimer, the term of this patent is extended or adjusted under 35 U.S.C. 154(b) by 124 days.

(21) Appl. No.: 11/485,674

(22) Filed: Jul. 13, 2006

(65) Prior Publication Data

US 2007/0024697 A1 Feb. 1, 2007

(30) Foreign Application Priority Data

Aug. 1, 2005 (DE) .................. 10 2005 036 096

(51) Int. Cl.
*B41J 2/435* (2006.01)
*B41J 2/47* (2006.01)
*B41J 29/393* (2006.01)

(52) U.S. Cl. .................... 347/234; 347/19; 347/248

(58) Field of Classification Search .................. 347/19, 347/234–237, 247–250; 250/227.14
See application file for complete search history.

(56) References Cited

U.S. PATENT DOCUMENTS 7,012,629 B2 * 3/2006 Ohba et al. ................ 347/250
2004/0159780 A1 * 8/2004 Fischer et al. .......... 250/227.14
2005/0104952 A1 5/2005 Haushahn et al.

FOREIGN PATENT DOCUMENTS

DE 103 53 029 B3 8/2004

* cited by examiner

*Primary Examiner*—Hai C Pham
(74) *Attorney, Agent, or Firm*—Laurence A. Greenberg; Werner H. Stemer; Ralph E. Locher

(57) ABSTRACT

A method and a device adapt the number of stepping motor cycles K to a temperature-dependent length change of a feed spindle in an exposer for recording printing originals. The length change is measured via a reference rod, which is disposed parallel to the feed direction of the exposure head carrier. A reference distance is disposed on the reference rod. The exposure head carrier is located on a feed spindle, which is driven by a stepping motor. A number $K_0$ of cycles of the stepping motor per revolution of the exposure drum for a specific printing result is determined once. A corrected number $K_k$ of stepping motor cycles for achieving the same printed result is then determined as a function of the different temperature-dependent length changes of feed spindle and reference rod.

21 Claims, 1 Drawing Sheet

METHOD AND DEVICE FOR COMPENSATING FOR A TEMPERATURE-DEPENDENT LENGTH CHANGE OF THE FEED SPINDLE OF A PRINTING PLATE EXPOSER

BACKGROUND OF THE INVENTION

Field of the Invention

The invention relates to a method and a device for adapting a number of stepping motor cycles per revolution of an exposure drum to a temperature-dependent length change of a feed spindle having an expansion coefficient in an exposer for recording printing originals. The method includes moving an object carrier axially along the exposure drum in a feed direction on the feed spindle with a stepping motor, and performing a basic setting by setting a first number of stepping motor cycles per revolution of the exposure drum. A reference distance is provided that is substantially parallel to the feed direction using a reference object having an expansion coefficient.

In reproduction technology, printing originals for printed pages which contain all the elements to be printed such as texts, graphics and images are produced. For color printing, a separate printing original is produced for each printing ink and contains all the elements which are printed in the respective color. For four-color printing, these are the printing inks cyan (C), magenta (M), yellow (Y) and black (K). The printing originals separated in accordance with printing inks are also referred to as color separations. The printing originals are generally scanned and, by using an exposer, are exposed onto films, with which printing plates for printing large editions are then produced. Alternatively, the printing originals can also be exposed directly onto printing plates in special exposure devices, or they are transferred directly as digital data to a digital press. There, the printing-original data is then exposed onto printing plates, for example with an exposing unit integrated into the press, before the printing of the edition begins immediately thereafter.

According to the current prior art, the printing originals are reproduced electronically. In this case, the images which are not present in digital form are scanned in a color scanner and stored in the form of digital data. Digital images can be produced, for example, by digital cameras. Texts are produced with text processing programs and graphics with drawing programs. Using a layout program, the image, text and graphic elements are assembled to form a printed page. Once separated into printing colors, the printing originals are then present in digital form. The data formats largely used nowadays to describe the printing originals are the page description languages PostScript and portable document format (PDF). In a first step, the PostScript or PDF data is converted in a raster image processor (RIP) into color separation values for the color separations C, M, Y, K before the recording of the printing originals. In the process, for each image point, four color separation values are produced as tonal values in the value range from 0 to 100%. The color separation values are a measure of the color densities with which the four printing inks cyan, magenta, yellow and black have to be printed on the printing material. In cases in which printing is carried out with more than four colors, each image point is described by as many color separation values as there are printing inks. The color separation values can be stored, for example, as a data value with 8 bits for each image point and printing ink, with which the value range from 0% to 100% is subdivided into 256 tonal value steps.

The data from a plurality of printed pages is combined with data from further elements, such as register crosses, cutting marks and folding marks and print control fields, to form printing originals for a printed sheet. The printed sheet data is likewise provided as color separation values (CMYK).

Different tonal values of a color separation to be reproduced may be reproduced in the print only by surface modulation of the printing inks applied, that is to say by screening. The surface modulation of the printing inks can be carried out, for example, in accordance with a halftone method, in which the various tonal value steps of the color separation data are converted into halftone dots of different size, which are disposed in a regular pattern with periodically repeating halftone cells. A halftone cell for a typical #60 screen contains a square with 1/60 cm edgelength, i.e. a halftone cell has the dimensions 166 µm×166 µm. During the recording of the color separations on a printing plate, the halftone dots in the individual halftone cells are assembled from exposure points which are an order of magnitude smaller than the halftone dots. A typical resolution of the exposure points is, for example, 1000 exposure points per centimeter, that is to say an exposure point has the dimensions 10 µm×10 µm. Conversion of the color separation values into halftone dots takes place in a second step during the further processing of the color separation data in the raster image processor, as a result of which the color separation data is converted into high-resolution binary values with only two lightness values (exposed or not exposed) which form the pattern of the modulated dot grid. In this way, the printing original data of each color separation is described in the form of a high-resolution halftone bitmap which, for each of the exposure points on the printed area, contains a bit which indicates whether this exposure point is to be exposed or not.

In the recording devices which are used in electronic production technology for the exposure of printing originals and printing forms an exposure beam, for example a laser beam is generated by a laser diode, shaped by optical devices and focused on to the recording material and deflected over the recording material point by point and line by line by a deflection system. There are also recording devices which, in order to increase the exposure speed, produce a bundle of laser beams, for example with a separate laser diode for each laser beam, and expose a plurality of image lines of the printing form simultaneously each time they sweep across the recording material. Nowadays, the printing forms used are printing plates, which are exposed in a plate exposer or directly in a digital press, into which a unit for plate exposure is integrated. The recording material can be located on a flat surface (flatbed exposer), in a cylindrical hollow (internal drum exposer) or on a drum (external drum exposer). The printing original can be exposed first onto film material, so that what are known as color separation films are produced, which are then used for the production of printing plates by a photographic copying process.

Flatbed exposers operate for the most part with a rapidly rotating polygonal mirror, whose mirror surfaces deflect the laser beam transversely over the recording material, while at the same time the recording material is moved at right angles to the deflection direction of the laser beam. In this way, exposure is carried out recording line by recording line. Since, during the movement of the laser beam over the recording material, the length of the light path changes, complicated imaging optics which compensate for the change in size of the exposure point caused by this are needed.

In the case of an internal drum exposer, the material to be exposed is mounted on the inner surface of a partly open hollow cylinder and exposed with a laser beam which is aimed along the cylinder axis onto a deflection device which reflects the laser beam perpendicularly onto the material. The deflection device, a prism or a mirror, rotates at high speed during operation and, and the same time, is moved in the direction of the cylinder axis, so that the deflected laser beam describes circular or helical recording lines on the material.

In the case of an external drum exposer, the material to be exposed, in the form of films or printing plates, is mounted on a drum mounted such that it can rotate. As the drum rotates, an exposure head is moved axially along the drum at a relatively short distance. The exposure head is moved in the feed direction by a feed spindle, to which it is connected with a form fit and which is set rotating by a stepping motor. The exposure head focuses one or more laser beams onto the drum surface, sweeping over the drum surface in the form of helices. In this way, during each drum revolution, one or more recording lines are exposed onto the recording material.

In order to shorten the exposure time and therefore to increase the economy of the exposer, external drum exposers are preferably operated with one or more exposure heads, which each, by use of exposure optics, image a bundle of N laser beams as a linear array of exposure points oriented in the axial direction of the exposer drum on the surface of the recording material. If there is a plurality of exposure heads, the exposure heads are, for example, disposed on an exposure head carrier which is connected to the feed spindle, so that, by the rotary movement of the feed spindle, all the exposure heads are moved jointly along the exposure drum in the feed direction. The exposure heads are disposed in the axial direction on the exposure drum at a distance which is a fraction of the axial drum length, for example, in the case of three exposure heads, one third of the axial drum length. In order to record a printing original over the entire drum length, the exposure head carrier then needs to be moved by the feed spindle only over a distance which corresponds to the distance between the exposure heads. Each exposure head then exposes only a recording strip of the printing original.

The recording time for the printing original is correspondingly short.

The number of laser beams which each exposure head images on the recording material is, for example, N=64, but can also be any other desired number. When the exposure drum rotates, a plurality of groups of in each case N recording lines are then exposed in parallel, winding helically around the surface of the exposure drum. The feed speed of the exposure heads is set such that, after one drum revolution, they have moved in the axial direction of the drum by a distance which corresponds to the width of the N recording lines. As a result, the N recording lines to be exposed during the next drum revolution immediately follow the N recording lines exposed during the preceding drum revolution. In another operating mode, what is known as the interleave writing method, the laser beams are not imaged as N exposure points with the spacing of one recording line width in each case but with a greater spacing which corresponds to a multiple P of the width of a recording line. For suitable relationships between N and P, during successive drum revolutions, the gaps between the recording lines initially exposed are gradually filled with further recording lines.

Given the high resolution of 1000 recording lines per centimeter, the spacing of the recording lines is 10 μm.

This spacing must always be maintained with high precision. In particular, following a drum revolution, the next N recording lines must follow the previously exposed recording lines without any gaps. If exposure is carried out with a plurality of exposure heads, the spacing must additionally be maintained between the last recording line of one exposure head and the first recording line of the adjacent exposure head, that is to say where the recording strips exposed by the individual exposure heads adjoin one another. If the line spacing is not maintained accurately, disruptive patterns are produced in the recorded printing original, to which the eye is particularly sensitive. Therefore, the feed distance of the exposure heads for each drum revolution must always be constant, irrespective of temperature changes or other disruptive influences. In particular, the requisite accuracy for the feed distance for the exposure of a recording strip is ±1 μm.

It is normal for the drive used for the feed spindle to be a stepping motor, and for the feed distance to be set by the number of stepping motor cycles which the stepping motor receives during a specific number of drum revolutions. In particular, the temperature-induced length change of a spindle has the effect that the feed distance for the number of stepping motor cycles set in this way fluctuates. For a typical feed distance of 200 mm, the length change is 2.2 μm per degree Celsius, that is to say already 22 μm for a temperature change of 10 degrees. This change is so large that the requisite accuracy of the drive cannot be maintained without corrective measures.

In order to reduce this problem, the printing original exposer could be set out in an air-conditioned room, but this entails restrictions and gives rise to high costs. Another possibility is conditioning the air in the interior of the printing original exposer. However, various problems are encountered in this case. In order to reduce the penetration of dust and gases from outside, a slight positive pressure is produced in the interior. The recording material is fixed on the exposer drum with the aid of a vacuum. Particles and gases produced during exposure with powerful laser beams have to be extracted in order to protect the units in the exposer, in particular the optical components, against contamination. All these various air movements increase the difficulties and the effort for implementing an effective air-conditioning system, largely sealed off from the external conditions, for the air in the interior of the exposer. In addition, the requisite accuracy, specifically the temperature of the feed spindle, can barely be kept constant to half a degree. In addition, methods which measure the temperature of the feed spindle and, if necessary, components associated with the feed drive and calculate the length change of the feed distance therefrom are not sufficiently reliable and accurate.

In order to image a printing plate in a suitable way despite temperature-dependent length changes of the feed spindle that occur, a method and a device for measuring the length change and a corresponding correction to the drive stepping motor are proposed in German patent DE 103 53 029 B3, corresponding to U.S. patent publication No. 2005/0104952 A1. The measurement of the length change is in this case carried out via a reference rod which is disposed parallel to the feed direction of the exposure head carrier. A reference distance is disposed on the reference rod. An optimum number $M_0$ of stepping motor cycles which the stepping motor needs in order to transport the exposure head carrier along the reference distance so that one or more exposure heads on the exposure head carrier image a printing plate on an exposer drum optimally is measured once. Before each further imaging, a further number $M_x$ which is needed for the movement of the exposure head carrier along the reference distance is then registered. The number of stepping motor cycles depends on the temperature-dependent length change of the feed spindle, while the length of the reference distance does not change. If, for the optimal imaging of the entire plate, a specific section of the plate or during one drum revolution during the first optimal imaging described, $K_0$ stepping motor cycles are needed, then the result for corresponding imaging in the case of a feed spindle with a changed length is a corrected stepping motor cycle number $K_x$, which results from a modification of the number $K_0$ with the ratio of $M_x/M_0$:

$$K_x = K_0 * M_x/M_0.$$

$K_x$ and $K_0$ in each case correlate with a specific number of drum revolutions and, thereby, determine the feed speed of the spindle.

In German patent DE 103 53 029 B3, provision is made for the reference distance not to change its length during the measurements. This is first the case when use is made of a material whose dimensions are substantially uninfluenced by temperature changes, such as glass or ceramic; second, this constancy of the reference distance can be achieved by the reference rod for the reference distance being kept at a constant temperature by a temperature control system. The necessary temperature control system is relatively complicated and costly. Temperature control liquids can run out and cause damage, or corrosion is possible. When temperature-stable reference rods of glass or ceramic are used it must be noted that they can be relatively expensive to produce and cannot always be adapted ideally to all requirements.

SUMMARY OF THE INVENTION

It is accordingly an object of the invention to provide a method and a device for compensating for a temperature-dependent length change of the feed spindle of a printing plate exposer which overcome the above-mentioned disadvantages of the prior art devices and methods of this general type.

With the foregoing and other objects in view there is provided, in accordance with the invention, a method for adapting a number of stepping motor cycles K per revolution of an exposure drum to a temperature-dependent length change of a feed spindle having a first expansion coefficient $\alpha_{SP}$ in an exposer for recording printing originals. The method includes moving an object carrier axially along the exposure drum in a feed direction on the feed spindle using a stepping motor. A basic setting is performed by setting a first number $K_0$ of stepping motor cycles per revolution of the exposure drum. A reference distance is provided that is substantially parallel to the feed direction using a reference object having a second expansion coefficient of $\alpha_{RS}$. To perform a recording of the printing original, a corrected number $K_k$ of stepping motor cycles per revolution of the exposure drum in accordance with relationship $K_k = c*K_0$ is set. A correction factor c is set in dependence on different temperature-dependent length expansions of the feed spindle and of the reference object.

For the recording of the printing original, a corrected number $K_k = c \times K_0$ as stepping motor cycles for each revolution or pay exposure drum is set. For this purpose, the correction factor c is determined and set as a function of the different temperature-dependent length expansions of the feed spindle and of the reference object. For this purpose, provision is made for the reference object to have an expansion coefficient $\alpha_{RS}$ which is considerably different from zero and from the expansion coefficient $\alpha_{SP}$ of the feed spindle.

For this purpose, in a development of the invention, the correction factor c is determined as a function of the difference $\alpha_{RS} - \alpha_{SP}$ and numbers $M_0$ and $M_x$. Here, $M_0$ is the number of stepping motor cycles which the object carrier needs in order to travel over a reference difference substantially parallel to the feed direction, while $M_x$ is the number of stepping motor cycles which the object carrier needs in order to travel over the reference distance immediately before a recording of a printing original.

For the recording of the printing original, provision is advantageously made for a corrected number $K_k$ of stepping motor cycles per revolution of the exposure drum to be set in accordance with the relationship $$K_k = C \times K_0$$

and for the correction factor C to be determined in accordance with the relationship:

$$C = \cfrac{1}{1 + \alpha_{SP} \left\{ \cfrac{\dfrac{M_x}{M_0} - 1}{\alpha_{RS} - \alpha_{SP} \dfrac{M_x}{M_0}} \right\}}$$

Here, $K_0$ is the number of stepping motor cycles per revolution during a first laboratory measurement with an optimal exposure, $M_0$ is the number of cycles for traveling over a reference distance during an optimal exposure, and $M_x$ is the corresponding number before an exposure under changed temperature conditions.

Advantageously, during the calculation of the correction factor proposed here, a length change in the reference distance as a function of the temperature is taken into account. Via the two expansion coefficients $\alpha_{SP}$ and $\alpha_{RS}$, the different properties of the length changes for the feed spindle and also for the reference rod have also to be taken into account. It is thus not necessary for a reference rod to be used which does not change its length as a function of the temperature.

Particularly advantageously, in terms of the device, provision is made for the reference object to have an expansion coefficient $\alpha_{RS}$ which is different from zero and from the expansion coefficient $\alpha_{SP}$ of the feed spindle.

In particular, provision is made for the reference object used to be a reference rod which changes its expansion and therefore the length of the reference distance monotonically as a function of the temperature.

In particular, the intention is to use a reference object made of a material having a higher expansion coefficient $\alpha_{RS}$ than the expansion coefficient $\alpha_{SP}$ of the spindle. This makes it possible for the correction factor C to assume a value which is independent of measurement tolerances.

In order to achieve a particularly beneficial correction factor, provision is made for the ratio $$Q_a = \frac{\alpha_{RS}}{\alpha_{SP}}$$

of the expansion coefficients of reference object and feed spindle to be greater than 1.9. According to the invention, this can be achieved particularly beneficially by the reference rod or the reference object being formed from aluminum. The feed spindle will generally be made of steel. They will then result in the required ratio of the expansion coefficients. As a result, the correction factor C is less affected by errors.

As a result of a large difference between the expansion coefficients, a particularly distinctive, temperature-dependent change in the measured number of stepping motor cycles $M_x$ can be achieved.

In order to carry out the method, provision is made in one development for the starting point and the end point of the reference distance to be detected by at least one sensor. In terms of the device, this can be achieved by two reference marks being fixed to the reference rod or reference object, the starting point and the end point of the reference distance being identified by the reference marks and a reference mark sensor, with which the reference marks are detected, being provided on the object carrier. The object carrier can advantageously be an exposure head carrier.

Alternatively, it is also possible here for only one reference mark to be provided on the object carrier or exposure head carrier, and for two reference mark sensors, with which the starting point and the end point of the reference distance is identified, to be provided on the reference object. The reference mark can then be detected by these reference mark sensors.

Provision is particularly advantageously made for the reference mark sensor to be a forked light barrier.

In constructional terms, the reference object should advantageously be disposed in such a way that the reference object and the feed spindle in each case experience the same temperature changes.

The reference object can be, for example, an edge or metal carrier within the exposer. Provision is particularly advantageously made for it to be a reference rod which, as such, is ideally tailored to the requirements of the method described.

Other features which are considered as characteristic for the invention are set forth in the appended claims.

Although the invention is illustrated and described herein as embodied in a method and a device for compensating for a temperature-dependent length change of the feed spindle of a printing plate exposer, it is nevertheless not intended to be limited to the details shown, since various modifications and structural changes may be made therein without departing from the spirit of the invention and within the scope and range of equivalents of the claims.

The construction and method of operation of the invention, however, together with additional objects and advantages thereof will be best understood from the following description of specific embodiments when read in connection with the accompanying drawings.

DESCRIPTION OF THE PREFERRED EMBODIMENTS

Figure 1:
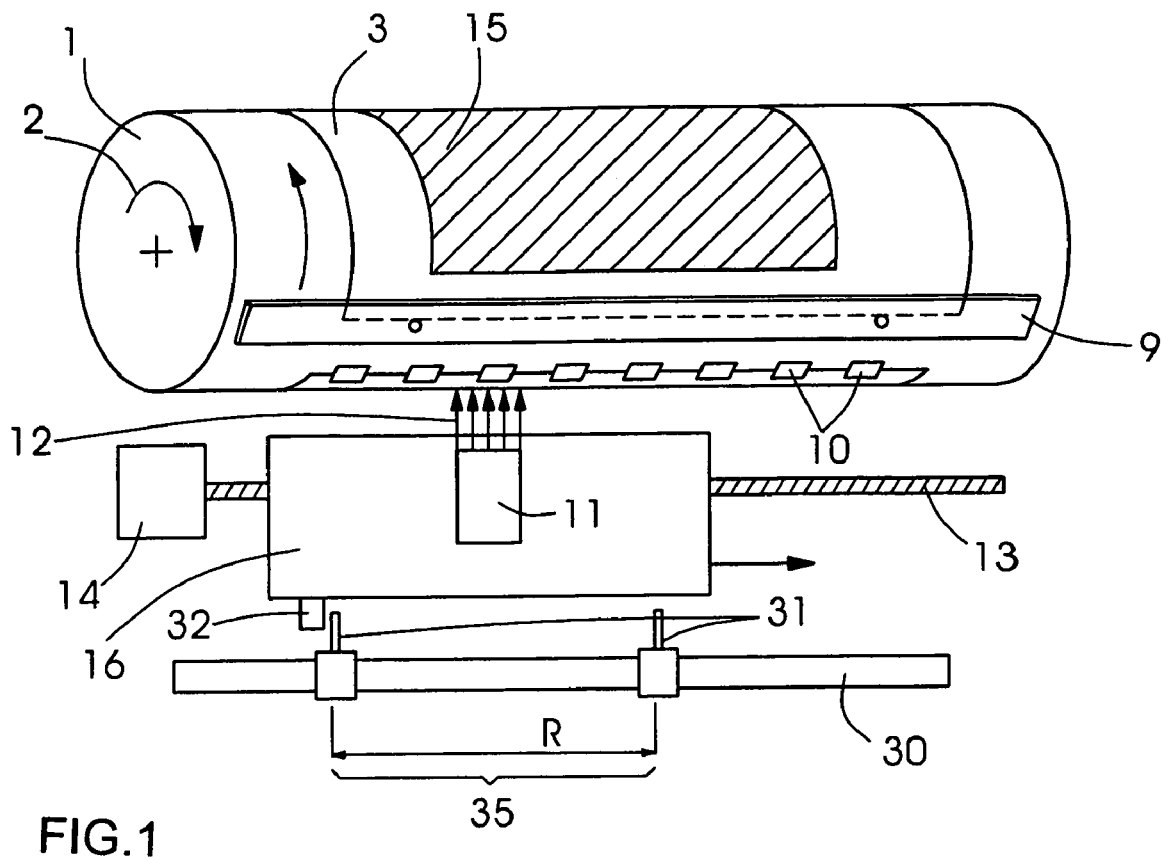
FIG. 1 is a diagrammatic, perspective view of a printing plate exposer having a device for compensating for a length of a feed spindle according to the invention.

Referring now to the figures of the drawing in detail and first, particularly, to FIG. 1 thereof, there is shown schematically the construction of an external drum exposer for exposing a printing plate 3 which is clamped on an exposure drum 1. The exposure drum 1 is rotatably mounted and can be set rotating in a uniform rotational movement in a direction of the rotation arrow 2 by a non-illustrated rotary drive. The printing plate 3 is fixed on a surface of the exposure drum 1 by a clamping strip 9 and clamping pieces 10. In addition, a non-illustrated vacuum device, can also be provided, which attracts the printing plate 3 to the drum surface by suction.

The printing plate 3 is exposed by an exposure head 11. The exposure head 11 is disposed on an exposure head carrier 16. Provision can in this case be made in particular for a plurality of exposure heads 11 to be located on an exposure head carrier 16. The plurality of exposure heads is then able to image the printing plates 3 in parallel. The exposure head 11 contains N non-illustrated laser diodes. The laser diodes emit N laser beams 12, which are focused on to the printing plate 3. In order to image the printing plate 3, the exposure drum 1 is set rotating and the exposure head carrier 16 is moved axially along the exposure drum 1 over a relatively short distance. At the same time, the N laser beams 12 expose the printing plate 3 in the form of helices on the basis of printing data which is transferred to the exposure head 11 from a non-illustrated printing data memory.

By use of the laser beams 12, recording lines are imaged on the printing plate 3. The recording lines from the different laser diodes are interleaved on the basis of the required resolution of the imaging. Given a resolution of A=100 recording lines per mm, the spacing of the recording lines is 10 µm. During one drum revolution, the exposure head 11 images a strip with a width Q on the printing plate 3. In this case, the strip width Q is given by the formula $$Q = N \cdot A.$$

The feed speed of the exposure head 11 must in this case be set such that, after one drum revolution, the exposure head 11 has been moved in the feed direction by the distance Q, so that recording lines exposed during a drum revolution adjoin one another seamlessly. In this case, the spacing in the feed direction must be 10 µm. If this spacing is not maintained, faults which are particularly sensitive to the eye can be detected in an exposed printed image 15. These faults can be gaps or overlaps of individual image regions. An accuracy of the connection between recording lines which lies around +/−1 µm is therefore required.

The feed distance of the exposure head 11 for each drum revolution is set by the number of motor cycles received by a stepping motor 14 of the feed spindle 13 during one drum revolution. The stepping motor 14 is, for example, a three-phase stepping motor which is driven with 10,000 motor cycles per spindle revolution. Given a pitch of the feet spindle 13 of 2 mm per spindle revolution, the result is a feed of 0.2 µm per motor cycle. Using such a stepping motor 14, the feed can be set sufficiently finely.

The length of the feed spindle 13 depends on the temperature prevailing in its surroundings. For this reason, the feed distance for a permanently set number of stepping motor cycles fluctuates. For a typical feed distance of 200 mm, the length change of the feed spindle is 2.2 µm per ° C., thus already 22 µm for a temperature change of 10 degrees. In this case, it does not matter in which direction the temperature changes, whether it becomes colder or warmer. The changes as a function of the temperature that are shown here are so great that the required accuracy of the feed of the exposure head 11 cannot be achieved without corrective measures.

For the purpose of adapting the feed speed of the exposure head 11 to the length change of the feed spindle 13, an appropriate device for adapting the number of stepping motor cycles K per revolution of the exposure drum 1 is provided here. The device contains a reference rod 30, to which a reference distance 35 is applied. The reference distance 35 is formed by two reference marks 31 which are applied to the reference rod 30. In this case, a first reference mark 31 describes the start of the reference distance 35, and a second reference mark 31 at a distance R from the first reference mark 31 describes the end of the reference distance 35. The reference marks 31 can be, for example, small metal flags which excite a reference mark sensor 32 to generate a measured signal. On the side of the exposure head carrier 16 there is the reference mark sensor 32, which is formed as a forked light barrier here. The forked light barrier 32 is in each case triggered and generates an appropriate signal when it registers a reference mark 31. The reference rod is in this case aligned parallel to the feed spindle 13, so that the reference marks 31 can in each case trigger the reference mark sensor 32.

Both the reference rod 30 and the feed spindle 13 change their length expansions as a function of the prevailing temperature. The temperature-dependent length changes are described by a material-dependent expansion coefficient α. The feet spindle 13 will generally be made of steel or stainless steel and has an expansion coefficient $\alpha_{SP}$ of $12 \times 10^{-6}$ per Kelvin. Therefore, the length of the feed spindle 13 changes by the factor $\alpha_{SP}$ in the event of a temperature change of 1 Kelvin. A search is made for a material for the reference rod 30 which has an expansion coefficient $\alpha_{RS}$ which is substantially different from the expansion coefficient $\alpha_{SP}$. In particular, provision is made for the expansion coefficient $\alpha_{RS}$ to be greater than $\alpha_{SP}$. For example, it can be aluminum in the case illustrated here. The expansion coefficient $\alpha_{RS}$ is then $23.8 \times 10^{-6}$ per Kelvin. In this way, it is always ensured that length changes of the reference rod 30 and of the feed spindle 13 differ so highly that, at a changed temperature, a different number of stepping motor cycles of the stepping motor 14 is needed in order for the exposure head carrier 16 to cover the reference distance 35. On the basis of this changed number of stepping motor cycles, the driving of the stepping motor 14 can then be adapted to the length change of the feed spindle 13.

The number of stepping motor cycles needed in order to travel over the reference distance 35 is counted by a non-illustrated counting device and stored by a non-illustrated storage device.

In order to adapt the number of stepping motor cycles K per revolution of the exposure drum 1 to the temperature-dependent length change of the feed spindle 13, a two-stage method is provided.

In a first calibration phase, at an arbitrary fixed temperature $T_0$, a test exposure of a printing plate 3 is carried out. The feed speed of the feed spindle is then varied in such a way that a number of stepping motor cycles per drum revolution is determined at which an optimal exposure occurs, that is to say without gaps or overlaps between two recording strips which are in each case exposed during a drum revolution. This then gives the calibration value $K_0$, which is stored in the printing plate exposer. Starting from this number of stepping motor cycles K per revolution, a second number of stepping motor cycles $m_0$ is determined which are needed in order to travel over the reference distance during the optimal exposure result. This value is also stored in a store belonging to the printing plate exposer.

The second phase of the method is the correction phase for determining the correction factor C which, applied to the calibration value $K_0$, results in a number $K_k$ of stepping motor cycles per revolution of the exposure drum 1 which is adapted to the length change of the feed spindle 13.

The correction phase is carried out before each exposure pass of the printing plate exposer. In this way, length changes of the feed spindle 13 can be taken into account for each new printing plate exposer, even if the temperature in and around the printing plate exposer were to fluctuate between two imaging operations.

Before the start of imaging, the exposure head carrier 16 is guided along the reference distance 35 on the feed spindle 13. The feed speed of the stepping motor 14 is in this case essentially unimportant, since a predefined distance is covered.

The counting device then counts the number of stepping motor cycles $M_x$, which are needed in order that the reference mark sensor 32 on the exposure head carrier 16 travels over the reference distance 35 from the start of the reference distance 35 formed by the reference mark 31 as far as the end of the reference distance 35 formed by the reference mark 31.

If the temperature at this measuring time is higher than the temperature $T_o$ during the calibration phase, then the reference rod 30 has expanded more highly than the feed spindle 13, on account of the higher expansion coefficient $\alpha_{RS}$. The number $M_x$ of stepping motor cycles is then therefore higher than the number $M_0$ which was recorded during the calibration phase. If, then, the different expansion coefficient $\alpha_{RS}$ and expansion coefficient $\alpha_{SP}$ are both known, the correction factor C is given by the measured values for the number of stepping motor cycles for traveling over the reference distance during the calibration phase and the correction phrase, in accordance with the relationship:

$$C = \frac{1}{1 + \alpha_{SP}\left\{\dfrac{\dfrac{M_x}{M_0} - 1}{\alpha_{RS} - \alpha_{SP}\dfrac{M_x}{M_0}}\right\}}$$

Here, it is also necessary to consider the fact that, although it is advantageous if the feed spindle 13 and the reference rod 13 are both in the same temperature environment, this is not a condition for a functioning method. However, a precondition for adapting the stepping motor cycles to the length change of the feed spindle is that the temperature difference between the feed spindle 13 and the reference rod 30 should remain as constant as possible. This is provided, for example, if the geometry of the reference rod 30 is adapted in such a way that the heat flows within the printing plate exposer always lead to the same temperature changes in feed spindle 13 and reference rod 30. A particularly accurate determination of the correction factor C results in particular if the distance between the start and end of the two reference marks 31 is chosen to be as large as possible.

The correction factor C determined in this way then permits the feed speed of the exposure head 16 needed to achieve an optimal imaging result to be achieved, in which a corrected number $K_k$ of stepping motorcycles of the stepping motor 14 per revolution of the exposure drum 1 is set in accordance with the relationship $K_k = C \times K_0$.

Figure 2:
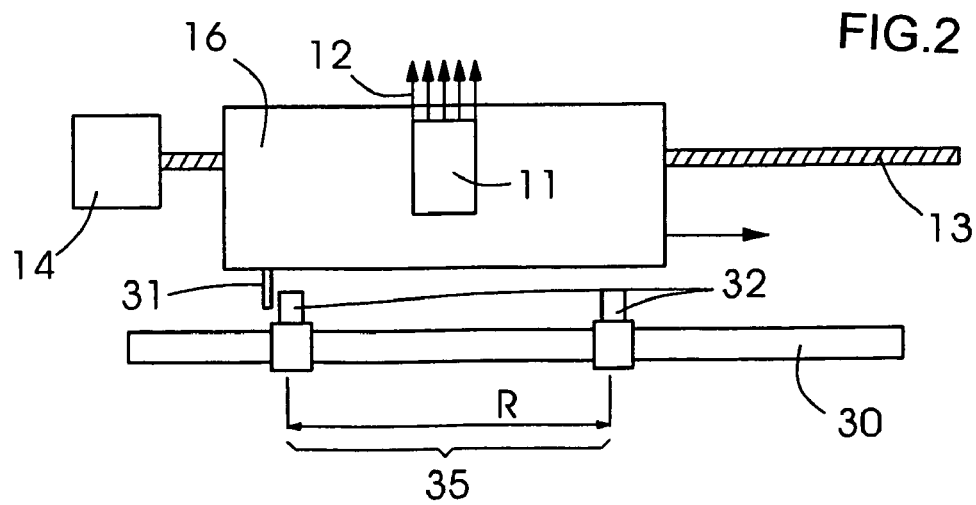
FIG. 2 is a diagrammatic, top plan view of an alternative device for compensating for the length of a feed spindle.

An alternative embodiment of the device for adapting the number of stepping motor cycles K per revolution of the exposure drum 1 is illustrated in FIG. 2.

In this case, the reference distance 35 is formed by two reference mark sensors 32, which are disposed on the reference rod 30. The distance between the two reference mark sensors 32 is therefore the distance R. The first reference mark sensor 32 forms the start of the reference distance 35, and the second reference mark sensor 32 forms the end of the reference distance 35. The reference mark sensors 32 can in particular be formed as forked light barriers, which are also described for FIG. 1. On the side of the exposure head carrier 16, a reference mark 31 is provided which triggers the reference mark sensor during a feed of the exposure head carrier 16. Here, too, the reference rod 30 is aligned parallel to the feed spindle 13. Identical reference numbers signify the same elements as in FIG. 1. Apart from interchanging reference mark sensors 32 with the reference mark 31 and vice versa, the construction of the alternative device shown here is identical to the construction of the device shown in FIG. 1. In addition, the method carried out in order to adapt the number of stepping motor cycles K is identical in each case. In particular, the methods and devices presented here are not restricted to the sensor concepts described. It is also possible for contact sensors or sensors via capacitances to be provided.

Provision can also be made for a plurality of exposure heads 11 to be provided on an exposure head carrier 16. Appropriate sensor concepts and exposure head arrangements on also described, for example, in German patent DE 103 53 029 B3.

This application claims the priority, under 35 U.S.C. § 119, of German patent application No. 10 2005 036 096.3, filed Aug. 1, 2005; the entire disclosure of the prior application is herewith incorporated by reference.

We claim:

1. A method for adapting a number of stepping motor cycles K per revolution of an exposure drum to a temperature-dependent length change of a feed spindle having a first expansion coefficient $\alpha_{SP}$ in an exposer for recording printing originals, which comprises the steps of:

moving an object carrier axially along the exposure drum in a feed direction on the feed spindle using a stepping motor;

performing a basic setting by setting a first number $K_0$ of stepping motor cycles per revolution of the exposure drum;

providing a reference distance substantially parallel to the feed direction using a reference object having a second expansion coefficient of $\alpha_{RS}$; and preparing to perform a recording of the printing original by setting a corrected number $K_k$ of stepping motor cycles per revolution of the exposure drum in accordance with relationship $K_k = c*K_0$ and setting a correction factor c in dependence on different values of the first and second expansion coefficients responsible for temperature-dependent length expansions of the feed spindle and of the reference object.

2. The method according to claim 1, which further comprises providing a reference rod as the reference object, the reference rod changing its expansion and therefore a length of the reference distance monotonically in dependence on temperature.

3. The method according to claim 1, wherein reference object is made of a material having the second expansion coefficient $\alpha_{RS}$ which is considerably different from zero and from the first expansion coefficient $\alpha_{SP}$ of the feed spindle.

4. The method according to claim 3, wherein the reference object is made of a material having the second expansion coefficient $\alpha_{RS}$ being higher than the first expansion coefficient $\alpha_{SP}$ of the feed spindle.

5. The method according to claim 4, which further comprises setting a ratio $$Q_a = \frac{\alpha_{RS}}{\alpha_{SP}}$$

to be greater than 1.9.

6. The method according to claim 1, which further comprises forming the reference object from aluminum.

7. The method according to claim 1, which further comprises detecting a starting point and an ending point of the reference distance using at least one sensor.

8. The method according to claim 1, which further comprises:

determining a number $M_0$ of the stepping motor cycles needed by the object carrier to travel over the reference distance substantially parallel to the feed direction;

immediately before the recording of the printing original, determining a number $M_x$ of the stepping motor cycles which the object carrier needs to travel over the reference distance; and determining the correction factor c in dependence on a difference $\alpha_{RS} - \alpha_{sp}$ of the first and second expansion coefficients and the numbers $M_0$ and $M_x$.

9. The method according to claim 8, which further comprises determining the correction factor in accordance with relationship $$C = \frac{1}{1 + \alpha_{SP}\left\{\frac{\frac{M_x}{M_0} - 1}{\alpha_{RS} - \alpha_{SP}\frac{M_x}{M_0}}\right\}}.$$

10. The method according to claim 1, which further comprises forming the object carrier as an exposure head carrier, and the first number $K_0$ corresponds to a number of stepping motor cycles at which a defined exposure result is achieved on a printing original by at least one exposure head on the exposure head carrier.

11. A device for adapting a number of stepping motor cycles K per revolution of an exposure drum to a temperature-dependent length change of a feed spindle having a first expansion coefficient $\alpha_{SP}$ in an exposer for recording printing originals, the exposer having an object carrier being moved axially along the exposure drum in a feed direction on the feed spindle by a stepping motor, the device comprising:

a reference object providing a reference distance, said reference object having a second expansion coefficient $\alpha_{RS}$ being considerably different from zero and from the first expansion coefficient $\alpha_{SP}$, said reference object configured to experience a temperature dependent change in length for changing said reference distance; and a counting device for determining a number of the stepping motor cycles needed by the object carrier to travel over the reference distance.

12. The device according to claim 11, wherein the second expansion coefficient $\alpha_{RS}$ of the object carrier being higher than the first expansion coefficient $\alpha_{SP}$ than the feed spindle.

13. The device according to claim 12, wherein a ratio $$Q_a = \frac{\alpha_{RS}}{\alpha_{SP}}$$

of the first and second expansion coefficients of said reference object and the feed spindle is greater than 1.9.

14. The device according to claim 12, wherein said reference object is formed of aluminum.

15. The device according to claim 11, further comprising:

two reference marks fixed to said reference object, a starting point and an ending point of the reference distance being identified by said reference marks; and a reference mark sensor for detecting said reference marks, said reference mark sensor being disposed on the object carrier.

16. The device according to claim 15, wherein said reference mark sensor is a forked light barrier.

17. The device according to claim 11, further comprising:

a reference mark disposed on the object carrier; and two reference mark sensors for identifying a starting point and an ending point of the reference distance, said reference mark sensors disposed on said reference object, and said reference mark being detected by said reference mark sensors.

18. The device according to claim 11, wherein said reference object and the feed spindle are constructed to be subjected to substantially the same temperature changes.

19. The device according to claim 11, wherein said reference object is a reference rod.

20. The device according to claim 11, wherein said object carrier is an exposure head carrier for carrying at least one exposure head.

21. An exposer for recording printing originals, the exposer comprising:

a exposure drum;

a feed spindle having a first expansion coefficient $\alpha_{SP}$;

a stepping motor;

an object carrier being moved axially along said exposure drum in a feed direction on said feed spindle by said stepping motor; and a device for adapting a number of stepping motor cycles K per revolution of said exposure drum to a temperature-dependent length change of said feed spindle, the device including:

a reference object providing a reference distance, said reference object having a second expansion coefficient $\alpha_{RS}$ being considerably different from zero and from the first expansion coefficient $\alpha_{SP}$, said reference object configured to experience a temperature dependent change in length for changing said reference distance; and a counting device for determining a number of the stepping motor cycles needed by said object carrier to travel over the reference distance.

* * * * *